United States Patent
Childress et al.

(10) Patent No.: US 7,698,807 B2
(45) Date of Patent: Apr. 20, 2010

(54) METHOD OF MANUFACTURING A MAGNETIC SENSOR BY MULTIPLE DEPOSITIONS OF VARYING GEOMETRY

(75) Inventors: Jeffrey Robinson Childress, San Jose, CA (US); Robert E. Fontana, Jr., San Jose, CA (US); Jeffrey S. Lille, Sunnyvale, CA (US)

(73) Assignee: Hitachi Global Storage Technologies, Netherlands B.V., Amsterdam (NL)

( * ) Notice: Subject to any disclaimer, the term of this patent is extended or adjusted under 35 U.S.C. 154(b) by 691 days.

(21) Appl. No.: 11/337,020

(22) Filed: Jan. 20, 2006

(65) Prior Publication Data

US 2007/0171581 A1    Jul. 26, 2007

(51) Int. Cl.
G11B 5/187    (2006.01)

(52) U.S. Cl. .............. 29/603.14; 29/603.12; 29/603.16; 360/324.1

(58) Field of Classification Search .............. 29/603.07, 29/603.12, 603.13, 603.15, 603.16, 603.18, 29/603.14; 360/324.1, 324.12, 324.2
See application file for complete search history.

(56) References Cited

U.S. PATENT DOCUMENTS

| | | | |
|---|---|---|---|
| 5,729,410 A | 3/1998 | Fontana, Jr. et al. | |
| 6,088,179 A * | 7/2000 | Sugahara et al. | 360/324.2 X |
| 6,466,419 B1 | 10/2002 | Mao | |
| 6,473,275 B1 | 10/2002 | Gill | |
| 6,542,341 B1 | 4/2003 | Carey et al. | |
| 6,671,139 B2 * | 12/2003 | Carey et al. | 360/324.12 |
| 6,674,615 B2 | 1/2004 | Hayashi | |
| 6,680,832 B2 | 1/2004 | Fontana, Jr. et al. | |
| 6,704,175 B2 | 3/2004 | Li et al. | |
| 6,747,852 B2 | 6/2004 | Lin et al. | |
| 2003/0203238 A1 | 10/2003 | Saito | |
| 2003/0231437 A1 | 12/2003 | Childress et al. | |

OTHER PUBLICATIONS

Rottmayer et al, "A New Design for an Ultra-High Density Magnetic Recording Head Using a GMR Sensor in the CPP Mode", IEEE Transactions on Magnetics, vol. 31, No. 6, Nov. 1995, pp. 2597-2599.*

Childress, J.R., Ho, M.K., Fontana, R.E., Carey, M.J., Rice, P.M., Gurney, B.A. & Tsang, C.H., "Spin-valve and tunnel-valve structures with in situ in-stack bias", IEEE Transactions on Magnetics, vol. 38, No. 5, Sep. 2002.

* cited by examiner

Primary Examiner—A. Dexter Tugbang

(57) ABSTRACT

Formation of the magnetic sensor layers of a magnetic sensor are separated into at least two depositions to reduce the dimension of the sensor. The free layer portion of the sensor is deposited at a different process step than the pinned layer portion. The top of the free layer stack can be a tunnel barrier, the free layer, or part of the free layer. The free layer stack also may contain an in-stack bias layer. The longitudinal bias layer may be patterned in a separate processing step, which allows the stack containing the free layer to be effectively thinner and allow smaller track width dimensions.

9 Claims, 3 Drawing Sheets

METHOD OF MANUFACTURING A MAGNETIC SENSOR BY MULTIPLE DEPOSITIONS OF VARYING GEOMETRY

BACKGROUND OF THE INVENTION

1. Technical Field

The present invention relates in general to magnetoresistive (MR) read sensors or heads for magnetic recording systems and, in particular, to an improved system, method, and apparatus for such sensors that operate with the current-perpendicular-to-the-plane mode.

2. Description of the Related Art

In certain types of MR read sensors or heads for magnetic recording systems, the sense current passes perpendicularly through the planes of the layers making up the sensor. Such sensors are called "current-perpendicular-to-the-plane" or CPP sensors. CPP sensors are distinguished from "spin-valve" type MR sensors widely used in commercially available magnetic recording disk drives because spin-valve sensors operate with the sense "current-in-the-plane" of the sensor layers, or in CIP mode.

One type of CPP sensor is a magnetic tunnel junction (MTJ) sensor comprising two ferromagnetic layers separated by a thin insulating tunnel barrier layer and is based on the phenomenon of spin-polarized electron tunneling. The response of a MTJ sensor is determined by measuring the resistance of the MTJ when a sense current is passed perpendicularly through the MTJ from one ferromagnetic layer to the other. The probability of tunneling of charge carriers across the insulating tunnel barrier layer depends on the relative alignment of the magnetic moments (magnetization directions) of the two ferromagnetic layers. In addition to MTJ sensors, giant magnetoresistive (GMR) type MR sensors have also been proposed to operate in the CPP mode.

One of the problems with CPP MTJ and GMR sensors is the ability to generate an output signal that is both stable and linear with the magnetic field strength from the recorded medium. The sensing ferromagnetic layer in the CPP sensor must be stabilized to avoid magnetic instabilities and degradation of the signal-to-noise performance of the sensor by hysteresis. The problem of sensor stabilization using a conventional tail stabilization approach is especially difficult in the case of a CPP sensor. For example, with an MTJ MR read head, the sense current passes perpendicularly through the ferromagnetic layers and the tunnel barrier layer. Thus, any hard bias metallic materials used in the tails to stabilize the sensing ferromagnetic layer will short circuit the electrical resistance of the MTJ if they come in contact with the ferromagnetic layers. This can be solved with a thin insulation layer as shown in U.S. Pat. No. 5,729,410, which is incorporated herein by reference. However, that solution is dependent on the spacing from the sensor to the hard bias layer and the shape of the hard bias layer.

One type of MTJ MR read head has a biasing ferromagnetic layer magnetostatically coupled with the sensing ferromagnetic layer of the MTJ to provide longitudinal bias to the sensing ferromagnetic layer. As shown in FIG. 1, this MTJ MR head is a sensor structure made up of a stack of layers formed between a bottom shield 10 and a top shield 12, the shields being typically formed of relatively thick highly magnetically permeable material, such as permalloy. The shields 10, 12 have generally planar surfaces spaced apart by a gap 53. The gap material 50, 52 on the sides of the sensor structure is an insulating material, typically an oxide such as alumina. The layers in the stack are a bottom electrical lead 20, the MTJ sensor 30, the longitudinal bias stack 40, and top electrical lead 22.

The MTJ sensor 30 is made up of an antiferromagnetic layer 32, a fixed ferromagnetic layer 34 exchange biased with the antiferromagnetic layer 32 so that its magnetic moment cannot rotate in the presence of an applied magnetic field, an insulating tunnel barrier layer 36 in contact with the fixed ferromagnetic layer 34, and a sensing or "free" ferromagnetic layer 38 in contact with the tunnel barrier layer 36 and whose magnetic moment is free to rotate in the presence of an applied magnetic field. The longitudinal bias stack 40 includes a nonmagnetic electrically conductive spacer layer 42, a biasing ferromagnetic layer 44 that has its magnetic moment aligned generally within the plane of the device and is separated from the ferromagnetic layer 38 by the spacer layer 42, and an optional antiferromagnetic layer 46 exchange coupled to the biasing ferromagnetic layer 44. The self field or demagnetizing field from the biasing ferromagnetic layer 44 magnetostatically couples with the edges of the sensing ferromagnetic layer 38 to stabilize its magnetic moment, and, to linearize the output of the device. The electrically conductive spacer layer 42 prevents direct exchange coupling between the biasing ferromagnetic layer 44 and the sensing ferromagnetic layer 38 in the MTJ sensor 30 and allows sense current to flow perpendicularly through the layers in the stack between the two leads 20, 22.

As shown in FIG. 1, the width of the data tracks of the recorded media is determined by the trackwidth (TW) of the MR sensor. The shielding geometry provided by shields 10, 12 of the MR sensor attenuates the flux coming from adjacent magnetic transitions of the recorded media along the down-track direction (perpendicular to the layers in the stack) and therefore enhances the sensor's linear resolution. However, for very small trackwidths this shielding geometry does not provide adequate suppression of side reading caused by flux coming from adjacent tracks. Thus, an improved design for an MR sensor that overcomes these limitations of the prior art would be desirable.

SUMMARY OF THE INVENTION

One embodiment of the present invention separates the formation of the magnetic sensor layers into at least two depositions to reduce the dimension of the sensor. For example, the free layer portion of the sensor may be deposited at a different process step than the pinned layer portion. This allows focus on the patterning of a thinner sensor from the entire device, thus allowing for smaller dimensions to be patterned. In one embodiment, the top of the free layer stack can be a tunnel barrier, the free layer, or part of the free layer. The free layer stack also may contain an in-stack bias layer. For example, the longitudinal bias layer may be patterned, in part, in a separate processing step. This allows the stack containing the free layer to be effectively thinner and allow smaller track width dimensions. In addition, magnetic and structural coupling issues are overcome to achieve a high sensitivity device.

The present invention also has the advantage of allowing for the option of patterning the active or free layer of a sensor where the materials that must be patterned are thinner than a full sensor stack. Thinner patterned sensor portions allow for small dimensions to be achieved. In one embodiment, the free layer bias structure is much larger than the free layer portion of the sensor. To avoid any potential problems relating to exposure of the free layer to additional processing, the free layer may be embedded between a spacer layer in the structure and allows for a two-part structure that forms the whole free layer bias structure. The spacer may comprise a tunnel barrier that would break the magnetic exchange.

Thus, the present invention provides a CPP sensor that has a two-step bias layer at the interface in the CPP sensor that is above and/or below the central region of the sensor, or the portion that contains the free layer. The present invention also provides a method to fabricate such a structure while demonstrating control over the thickness of the overall structure.

The foregoing and other objects and advantages of the present invention will be apparent to those skilled in the art, in view of the following detailed description of the present invention, taken in conjunction with the appended claims and the accompanying drawings.

BRIEF DESCRIPTION OF THE DRAWINGS

So that the manner in which the features and advantages of the invention, as well as others which will become apparent are attained and can be understood in more detail, more particular description of the invention briefly summarized above may be had by reference to the embodiment thereof which is illustrated in the appended drawings, which drawings form a part of this specification. It is to be noted, however, that the drawings illustrate only an embodiment of the invention and therefore are not to be considered limiting of its scope as the invention may admit to other equally effective embodiments.

DETAILED DESCRIPTION

Figure 1:
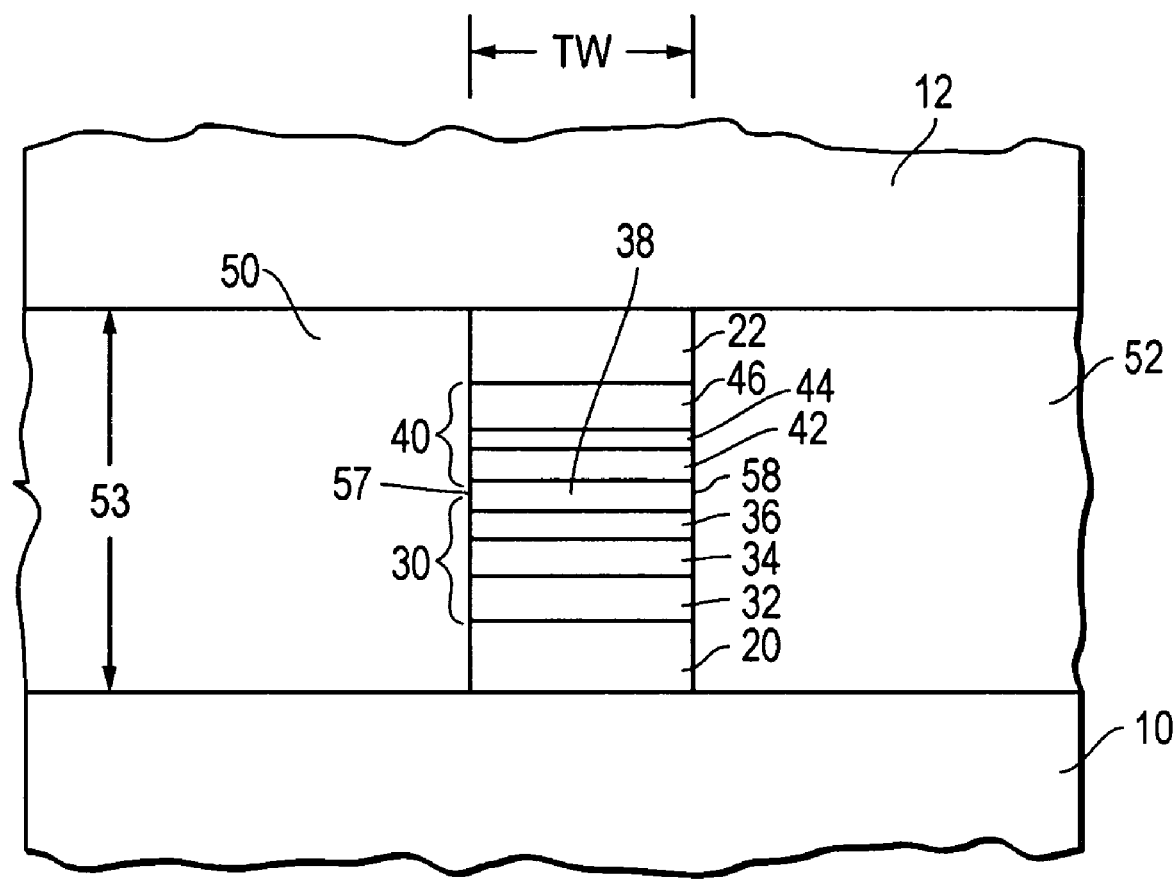
FIG. 1 is a schematic drawing of a prior art CPP sensor having in-stack longitudinal biasing with a conventional shield geometry.
Figure 2:
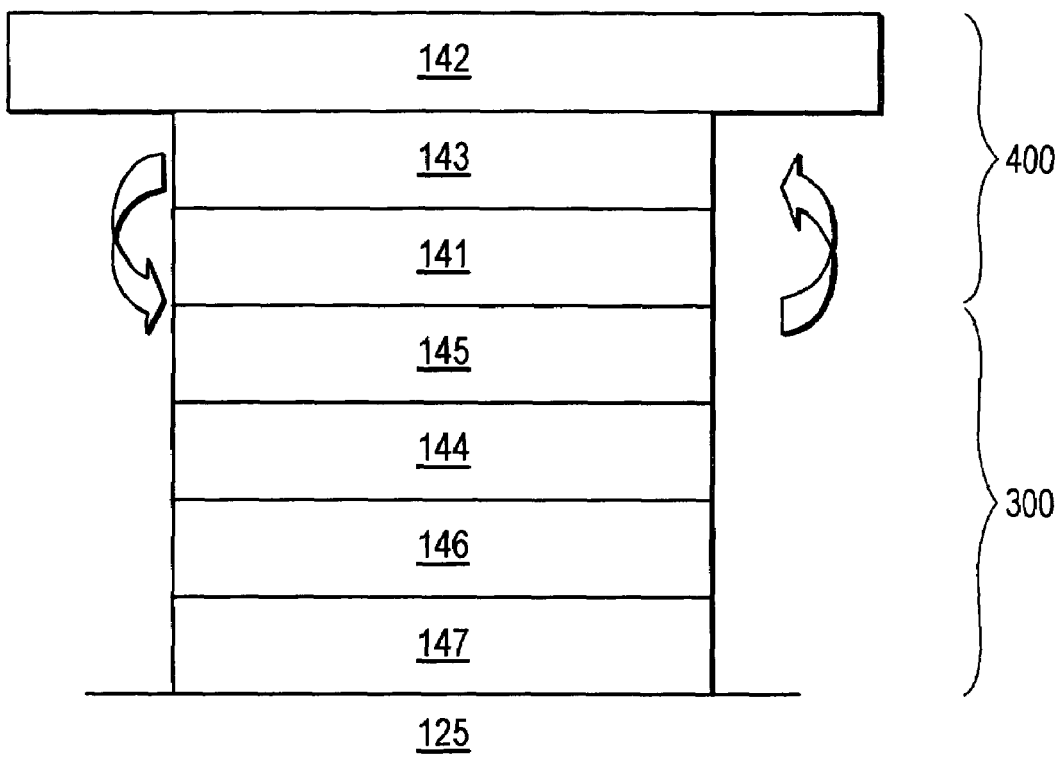
FIG. 2 is a schematic drawing of one embodiment of a sensor structure constructed in accordance with the present invention, illustrating a first deposit step.

Referring to FIG. 2, one embodiment of a multilayer structure for a thin film CPP magnetic sensor is shown. According to the illustrated embodiment of the multilayer structure, a plurality of materials is consecutively stacked on an underlayer 125. The underlayer 125 comprises a collector, bottom lead, and shield. In the embodiment shown, the multilayer structure may comprise the following materials and thicknesses: PtMn (15 mn), CoFe (2 nm), Ta (2 nm), NiFe (4 nm), Cu (2 nm), CoFe (2 nm), and IrMn (8 nm). The numerical values given in parentheses for the layers are the thicknesses of the layers in units of nanometers (nm). One skilled in the art will recognize that these materials and the numerical values are given by way of example and for reference purposes for only one embodiment of the present invention. The present invention is not limited to such materials or values.

In this embodiment of the multilayer structure, the spacer layer 141 comprises Ta, the longitudinal bias antiferromagnetic (AFM) layer 142 comprises PtMn, the pinned layer 146 comprises CoFe, the biased magnetization layer (synthetic ferromagnetic structure) 143 also comprises CoFe, the non-magnetic conductive layer 144 comprises Cu, the free magnetization layer 145 comprises NiFe, and the pinning AFM layer 147 comprises IrMn. In one embodiment, at least a portion of the biased layer 143 is deposited separately from the free layer 145. These layers may be formed in one or more film forming chambers. Plasma treatment is suitably performed in the film forming steps.

Figure 3:
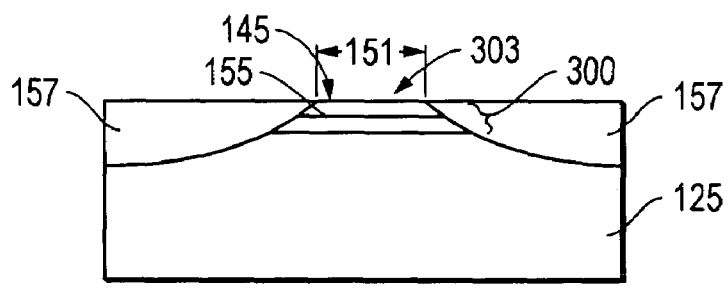
FIG. 3 is a schematic drawing of one embodiment of a sensor structure constructed in accordance with the present invention, illustrating a first deposit step.
Figure 4:
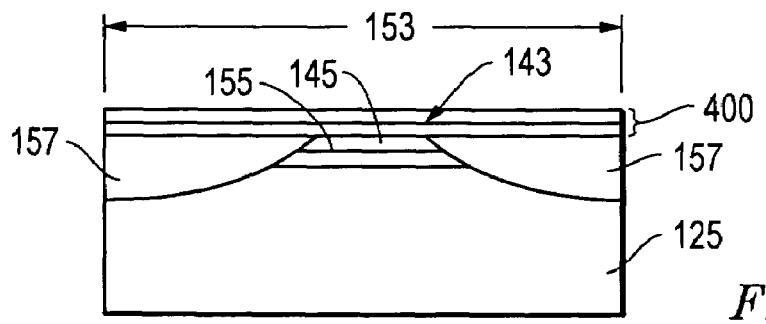
FIG. 4 is a schematic drawing of the sensor structure of FIG. 3, illustrating a second deposit step.

Referring now to FIGS. 3 and 4, another embodiment of the present invention is shown for fabricating a CPP magnetic sensor with more than one deposition. The sensor is formed in at least two depositions at a central region interface of the sensor to reduce a height and track width of the sensor. Although the following example is described as a two-step process for forming the sensor, the sensor also may be formed with three or more depositions.

In one embodiment, the underlayer 125 is provided, and a first or "bottom" portion 300 (see FIGS. 2 and 3) of the sensor containing multiple layers (including at least the free layer 145, but not necessarily the others) is deposited. The free layer 145 has a free layer width 151 and an optional tunnel barrier 155 that may be formed in or on top of free layer 145. This formation defines a top surface 303 of the bottom portion 300 of the sensor.

In a separate step, a second or "top" portion 400 (see FIGS. 2 and 4) of the sensor is deposited on top of the bottom portion 300 of the sensor. Comparing FIG. 4 to FIG. 3, the biased layer 143 of top portion 400 has a width 153 that is greater than the free layer width 151. The bottom portion 300 may be formed between insulators 157 as shown, while at least portions of the biased layer 143 may be deposited on top of the insulators 157. In one embodiment, the interface between the top portion 400 and the bottom portion 300 comprises similar materials to avoid interface effects that could degrade the sensor performance.

Figure 5:
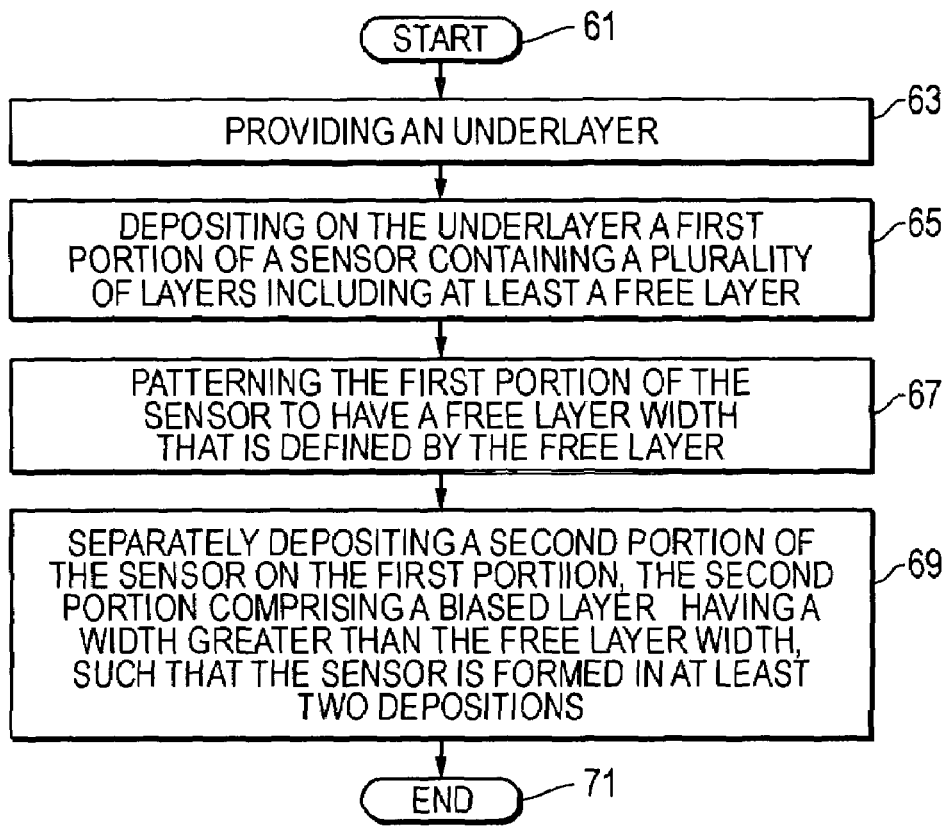
FIG. 5 is a high level flow diagram of one embodiment of a method constructed in accordance with the present invention.

As shown in FIG. 5, one embodiment of a method in accordance with the present invention starts (as indicated at step 61) and comprises providing a underlayer (step 63); depositing on the underlayer a first portion of a sensor containing a plurality of layers including at least a free layer (step 65); patterning the first portion of the sensor to have a free layer width that is defined by the free layer (step 67); and then separately depositing a second portion of the sensor on the first portion, the second portion comprising a biased layer having a width greater than the free layer width, such that the sensor is formed in at least two depositions (step 69); before ending (as indicated at step 71).

Alternatively, the method may include capping the first portion with a material that forms a part of a magnetic bias layer of the sensor and does not form part of the free layer; and then separately depositing a second portion of the sensor on the free layer, the second portion comprising a biased layer, the biased layer having a width greater than the free layer width, such that the magnetic bias layer of the sensor is formed in at least two depositions at a central region interface of the sensor to reduce a height and track width of the sensor.

The method may further comprise forming a tunnel barrier in or on top of the free layer. A top layer of the first portion may be formed from a nonmagnetic material at a thickness of 2 nm or less. The method may further comprise depositing a mechanically stressed biased layer with the free layer, and wherein the mechanically stressed biased layer comprises a longitudinally biased layer that is patterned, at least in part, in a separate step. In addition, the method may further comprises forming an in-stack bias layer with the free layer, and wherein the in-stack bias layer comprises a longitudinal bias layer that is patterned, in part, in a separate processing step.

In one embodiment, the longitudinal bias layer is formed from an antiferromagnetic material at a thickness of less than 30 nm. A first layer of the second portion may be formed from a nonmagnetic material at a thickness of 2 nm or less. The first portion may be formed between insulators, and portions of a pinned layer may be deposited on top of the insulators. In addition, the free layer may be formed from a material selected from the group consisting of CoFe, Co, Fe, and NiFe. The biased layer may be formed as an anti-parallel (AP) pinning structure comprising a ferromagnetic layer, a non-magnetic layer, and a ferromagnetic layer, and wherein the AP pinning structure is formed adjacent to an anti-ferromagnetic layer. Moreover, the biased layer may be formed by at least two depositions of anti-ferromagnetic materials.

In one embodiment, a CPP magnetic sensor constructed in accordance with the present invention comprises a bottom portion having a free layer and& a bottom portion width;- a top portion formed on the bottom portion, the top portion having a longitudinal bias layer, and a top portion width that is greater than the bottom portion width; and an interface between the bottom and top portions comprises a layer that forms a portion of a magnetically biased layer. The interface may comprise a non-magnetic material having adjacent layers that are formed from ferromagnetic materials.

Figure 6:
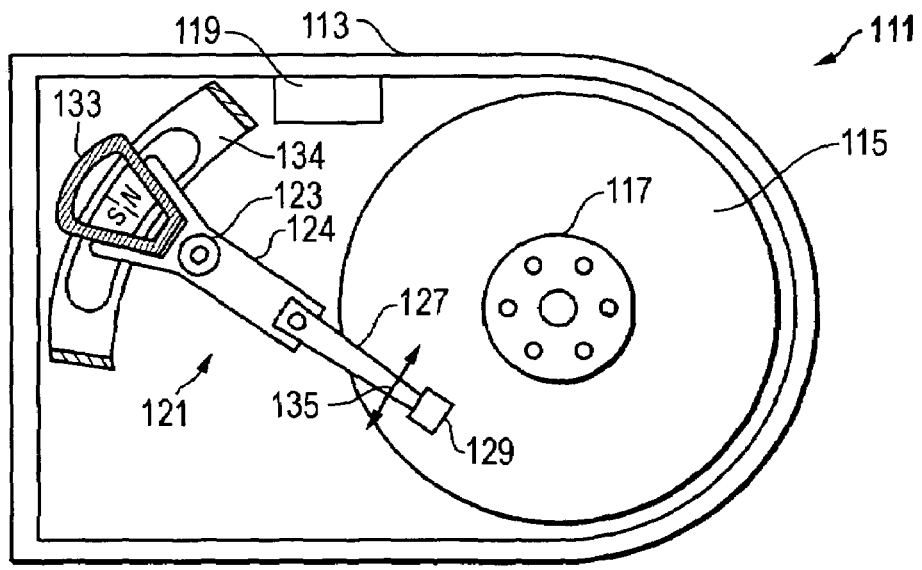
FIG. 6 is a schematic diagram of one embodiment of a storage device constructed in accordance with the present invention.

Referring now to FIG. 6, a schematic drawing of one embodiment of an information storage system comprising a magnetic hard disk file or drive 111 for a computer system is shown. Drive 111 has an outer housing or base 113 containing at least one magnetic disk 115. Disk 115 is rotated by a spindle motor assembly having a central drive hub 117. An actuator 121 comprises a plurality of parallel actuator arms 124 (one shown) in the form of a comb that is pivotally mounted to base 113 about a pivot assembly 123. A controller 119 is also mounted to base 113 for selectively moving the comb of arms 124 relative to disk 115.

In the embodiment shown, each arm 124 has extending from it at least one cantilevered load beam and suspension 127. A magnetic read/write transducer or head is mounted on a slider 129 and secured to a flexure that is flexibly mounted to each suspension 127. The read/write heads magnetically read data from and/or magnetically write data to disk 115, and incorporate the CPP magnetic sensor described above. The level of integration called the head gimbal assembly is head and the slider 129, which are mounted on suspension 127. The slider 129 is usually bonded to the end of suspension 127. The head is typically pico size (approximately 1250×1000×300 microns) and formed from ceramic or intermetallic materials. The head also may be femto size (approximately 850×700×230 microns) and is pre-loaded against the surface of disk 115 (in the range two to ten grams) by suspension 127.

Suspensions 127 have a spring-like quality which biases or urges the air bearing surface of the slider 129 against the disk 115 to enable the creation of the air bearing film between the slider 129 and disk surface. A voice coil 133 housed within a conventional voice coil motor magnet assembly 134 (top pole not shown) is also mounted to arms 124 opposite the head gimbal assemblies. Movement of the actuator 121 (indicated by arrow 135) by controller 119 moves the head gimbal assemblies radially across tracks on the disk 115 until the heads settle on their respective target tracks. The head gimbal assemblies operate in a conventional manner and always move in unison with one another, unless drive 111 uses multiple independent actuators (not shown) wherein the arms can move independently of one another.

The present invention has several advantages, including the ability to separate the formation of the magnetic sensor layers into at least two depositions to reduce the dimension of the sensor. The active or free layer of a sensor may be patterned where the materials are thinner than a full sensor stack. The thinner patterned sensor portions allow for small dimensions to be achieved. The free layer bias structure is much larger than the free layer portion of the sensor. To avoid any potential problems relating to exposure of the free layer to additional processing, the free layer is embedded between a spacer layer in the structure and allows for a two-part structure to form the whole free layer bias structure.

While the invention has been shown or described in only some of its forms, it should be apparent to those skilled in the art that it is not so limited, but is susceptible to various changes without departing from the scope of the invention.

What is claimed is:

1. A method of fabricating a CPP magnetic sensor, comprising:
   (a) providing a underlayer;
   (b) depositing on the underlayer a first portion of a sensor containing a plurality of layers including a free layer;
   (c) capping the first portion with a cap layer comprising an electrically conductive material that forms a part of a magnetic bias layer of the sensor and does not form part of the free layer;
   (d) patterning the first portion of the sensor to have a sensor width that is defined by the free layer;
   and then
   (e) separately depositing a second portion of the sensor on the first portion, the second portion comprising a biased layer, the biased layer having a width greater than the free layer width, such that the magnetic bias layer of the sensor is formed in at least two depositions at a central region interface of the sensor to reduce a height and track width of the sensor.

2. A method according to claim 1, wherein step (b) further comprises forming a tunnel barrier as a spacer between a pinned layer and the free layer.

3. A method according to claim 1, wherein the first portion comprises one of: a nonmagnetic conductive layer, a nonmagnetic conductive layer and a free magnetization layer, and a nonmagnetic conductive layer, free magnetization layer and a biased AFM layer.

4. A method according to claim 1, wherein step (b) comprises forming a top layer of the first portion from a nonmagnetic material at a thickness of 2 nm or less.

5. A method according to claim 1, wherein step (b) further comprises depositing a mechanically stressed biased layer with the free layer, and wherein the mechanically stressed biased layer comprises a longitudinally biased layer that is patterned, at least in part, in a separate step.

6. A method according to claim 1, wherein step (b) further comprises forming an in-stack bias layer with the free layer, and wherein the in-stack bias layer comprises a longitudinal bias layer that is patterned, in part, in a separate processing step, and wherein the longitudinal bias layer is formed from an antiferromagnetic material at a thickness of less than 30 nm.

7. A method according to claim 1, wherein step (b) comprises forming the first portion between insulators, and step (d) comprises depositing portions of the biased layer on top of the insulators.

8. A method according to claim 1, wherein step (e) comprises forming the biased layer as an anti-parallel (AP) pinning structure comprising a ferromagnetic layer, a non-magnetic layer, and a ferromagnetic layer, and wherein the AP pinning structure is formed adjacent to an anti-ferromagnetic layer.

9. A method according to claim 1, wherein step (e) comprises forming the biased layer with at least two depositions of anti-ferromagnetic materials.

* * * * *